(12) United States Patent
Rietzler et al.

(10) Patent No.: US 8,522,422 B2
(45) Date of Patent: Sep. 3, 2013

(54) METHOD FOR APPLICATION OF A CHIP MODULE TO AN ANTENNA

(75) Inventors: Manfred Rietzler, Marktoberdorf (DE); Raymond Freeman, Mesa, AZ (US)

(73) Assignee: Smartrac IP B.V., Amsterdam (NL)

( * ) Notice: Subject to any disclaimer, the term of this patent is extended or adjusted under 35 U.S.C. 154(b) by 209 days.

(21) Appl. No.: 12/933,711

(22) PCT Filed: Mar. 20, 2009

(86) PCT No.: PCT/EP2009/002067
§ 371 (c)(1),
(2), (4) Date: Sep. 21, 2010

(87) PCT Pub. No.: WO2009/118132
PCT Pub. Date: Oct. 1, 2009

(65) Prior Publication Data
US 2011/0016703 A1    Jan. 27, 2011

(30) Foreign Application Priority Data
Mar. 28, 2008    (DE) .......................... 10 2008 016 830

(51) Int. Cl.
*H01Q 17/00*    (2006.01)
(52) U.S. Cl.
USPC .................................. 29/601; 29/832; 29/846
(58) Field of Classification Search
USPC ................... 29/601, 729, 740, 832, 846, 847; 156/60, 73.1, 249, 250, 252, 253, 265, 267, 156/269, 277, 290, 292
See application file for complete search history.

(56) References Cited

U.S. PATENT DOCUMENTS

| | | | |
|---|---|---|---|
| 6,200,824 B1 | 3/2001 | Hashimoto | |
| 7,122,087 B2 * | 10/2006 | Kanda et al. | 156/73.1 |
| 7,842,156 B2 * | 11/2010 | Kline | 156/253 |
| 2007/0281391 A1 | 12/2007 | Ito et al. | |

FOREIGN PATENT DOCUMENTS

| | | |
|---|---|---|
| DE | 10 2005 015656 A1 | 10/2006 |
| DE | 10 2005 033 196 A1 | 1/2007 |
| EP | 1 699 078 A | 9/2006 |
| WO | 2004/088571 A2 | 10/2004 |

OTHER PUBLICATIONS

The International Search Report under date of Aug. 20, 2009 in connection with PCT/EP2009/002067.

* cited by examiner

*Primary Examiner* — Thiem Phan
(74) *Attorney, Agent, or Firm* — Quarles & Brady LLP

(57) ABSTRACT

A method for application of a chip module to an antenna module includes supplying a plurality of chip modules arranged in a row arrangement on a sheet carrier. Separating chip modules from the row arrangement and transferring the separated chip modules to a application device. The chip module separated from the row arrangement are subsequently positioned on the antenna substrate by the application device and contacting of the antenna contact surfaces of the chip module with the contact surfaces of the antenna is performed. The invention further relates to a device for the application of a chip module to an antenna module.

15 Claims, 7 Drawing Sheets

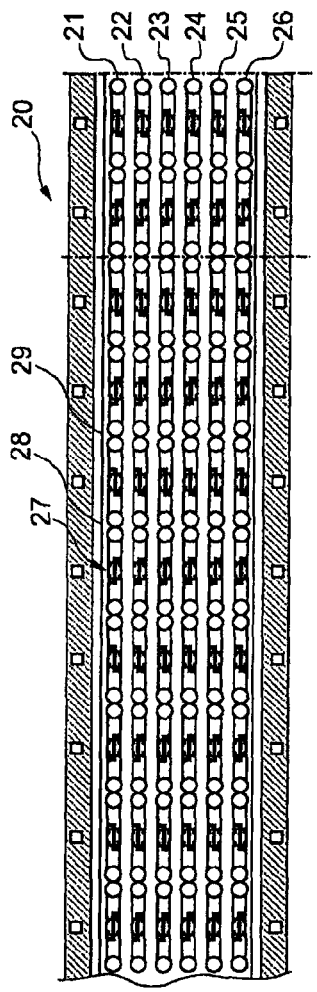
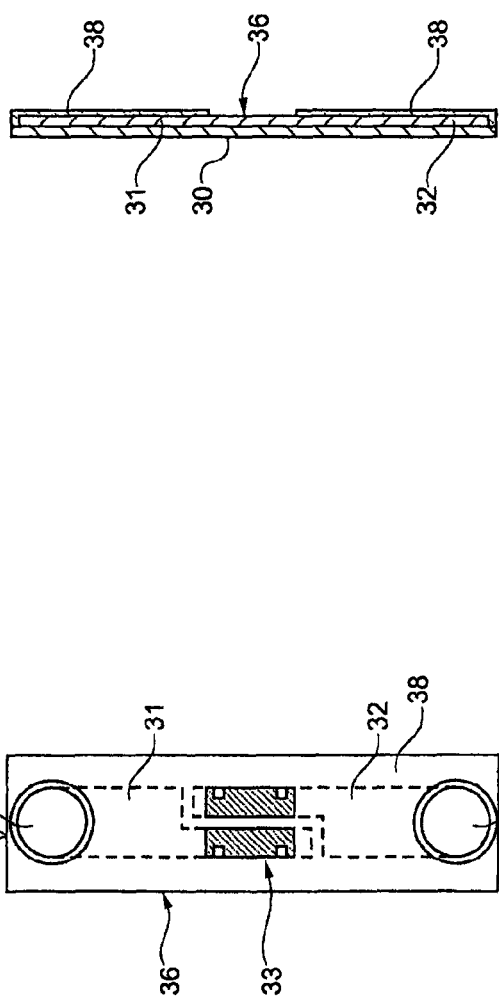
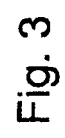
Fig. 1
Fig. 2
Fig. 3

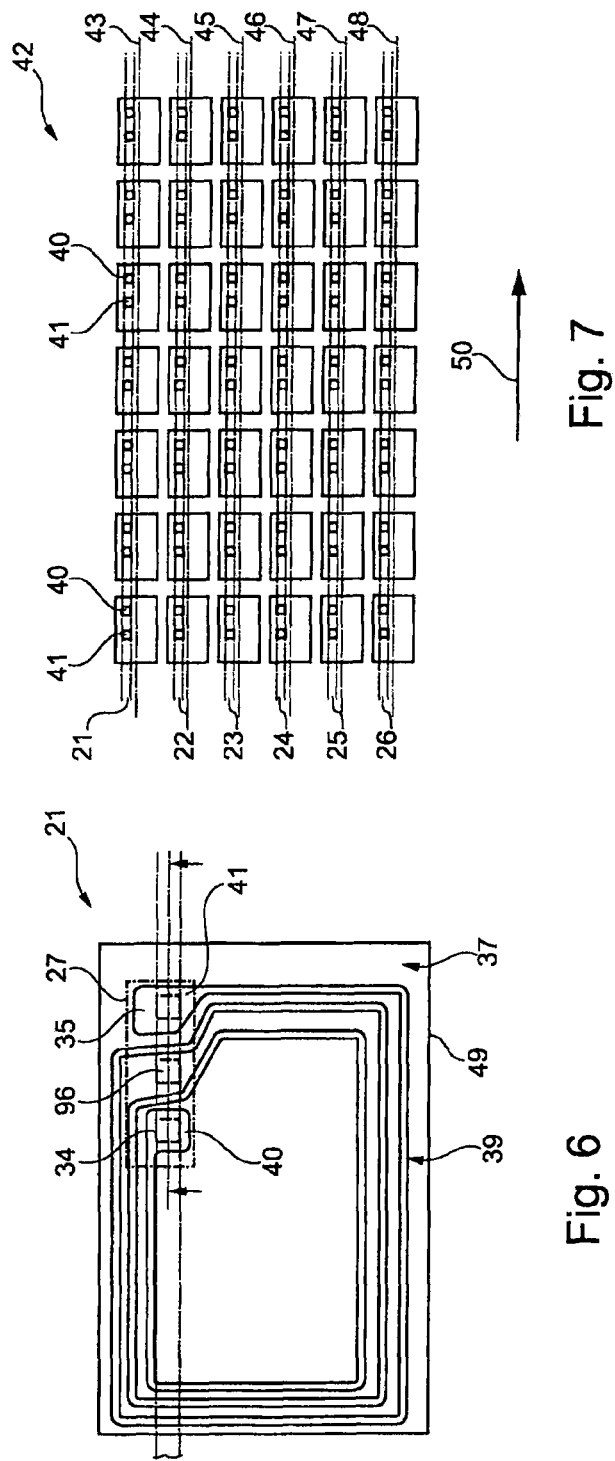

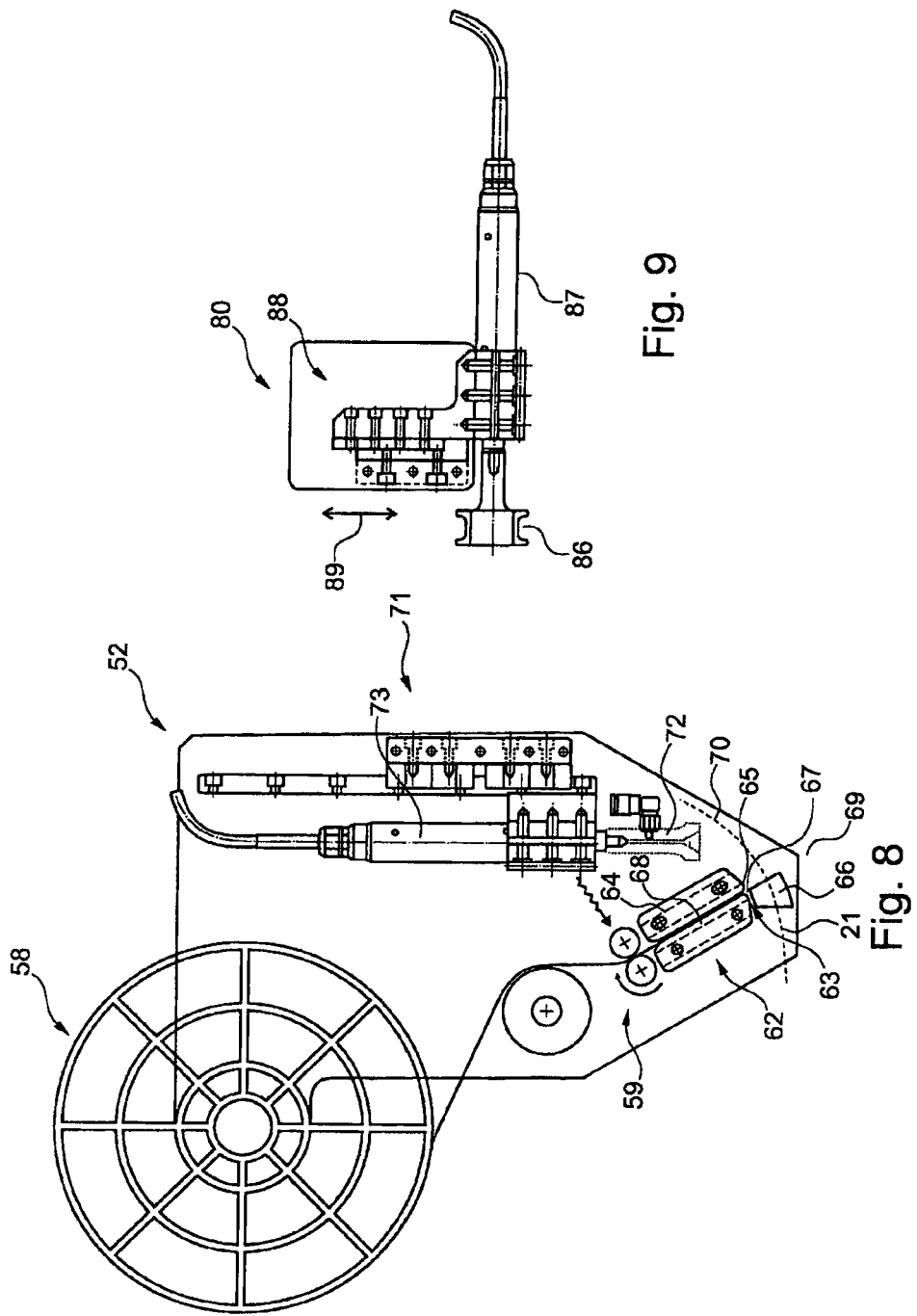

METHOD FOR APPLICATION OF A CHIP MODULE TO AN ANTENNA

CROSS REFERENCE TO RELATED APPLICATION

This application claims the priority benefit to PCT International Application No. PCT/EP2009/002067 filed on Mar. 20, 2009, which claims priority to German Patent Application No. 10 2008 016 830.0 filed on Mar. 28, 2008, both of which are fully incorporated herein by reference.

STATEMENT REGARDING FEDERALLY SPONSORED RESEARCH OR DEVELOPMENT

Not applicable.

FIELD OF THE INVENTION

The present invention relates to a method for application of a chip module on an antenna module, wherein antenna contact surfaces formed on an application side of the chip module are contacted with contact surfaces of an antenna disposed on an antenna side of an antenna substrate in an electrically conductive manner, wherein a plurality of chip modules are arranged in a row arrangement on a sheet carrier and the row arrangement is supplied to a separating device arranged at the application location by means of a supply device, the chip module separated from the row is subsequently positioned on the antenna substrate by means of an application device and contacting of the antenna contact surfaces of the chip module with the contact surfaces of the antenna is performed.

BACKGROUND OF THE INVENTION

During large-scale production of so-called transponder modules, antenna modules which each feature an antenna furnished with terminal contacts and disposed on an antenna substrate are conveyed past an assembly station in a matrix arrangement, in which the individual antennas are contacted with chip modules. In particular as a result of the large web widths of the antenna module webs, which are meanwhile common practice due to the matrix arrangement, equipment of the antennas with the chip modules requires the passage of sometimes extensive manipulation zones via which the chip modules need to be separately guided until contacting on the antenna substrates is realized. In this process, the supply of the chip modules is regularly performed transversely to the conveying direction of the antenna substrate web. Apart from the temporal expenditure involved in supplying the chip modules it has proven disadvantageous that the supply of the separated chips necessitates the installation of transport devices of correspondingly complex design.

SUMMARY OF THE INVENTION

Thus, it is an object of the present invention to make it possible to perform the supply of chip modules for subsequent contacting with the antenna modules more efficiently, namely in particular more rapidly and subject to comparatively reduced mechanical complexity.

This object is attained by a method in which, a plurality of chip modules disposed in a row arrangement on a sheet carrier are supplied to a separating device arranged at the application location. By means of this measure, the logistical and mechanical complexity involved in the handling and conveyance of chip modules, which have already been separated beforehand and which need to be separately transferred to the application location, can be dispensed with. Instead, according to the invention, the row arrangement per se, i.e. a simple forward movement of the row arrangement, is utilized for conveying the chip modules arranged in the row assembly to the application location and for separating the chip modules from the row assembly only at the location where the application is performed, for positioning the chip modules on the antenna substrate by means of the application device and for contacting the chip modules with the antenna.

According to the invention, the separation of the chip module is thus only performed in the region of the application device, so that the sheet carrier arrangement per se can be advantageously utilized for conveyance up to the application device.

The efficiency of the inventive method can be further enhanced if the sheet carrier features a plurality of row arrangements which extend in parallel to one another into the longitudinal direction of the sheet carrier and which are separated at a distance from the application location in order to be supplied to the separating device at the application location in the form of individual rows.

In this process, the separation of the row arrangements from the sheet carrier can be performed while the row arrangements are supplied to the separating device or else can be performed independently thereof, wherein concerning the latter case, the row arrangements separated from the sheet carrier can be arranged on a storage device in the form of a rolled-up storage roll and can be supplied to the separating device only subsequently starting from the storage device.

It is particularly advantageous in terms of a mechanically resistant and sealing connection of the chip module with the antenna module if subsequent to the positioning and preceding the contacting an adhesively bonded connection is established between the chip module and the antenna substrate in a contact region surrounding a chip and the antenna contact surfaces.

In contrast hereto, it is also possible that the adhesively bonded connection is established subsequent to contacting.

According to a particularly preferred method variant, for performing the separation, the row arrangement of the chip modules is guided out of a supply channel until a rear longitudinal end of the foremost chip module in the supply channel is brought into contact with a first fixed cutting edge of the separating device, which defines the end of the supply channel. Subsequently, a cutting arm comprising a second cutting edge is swiveled past the fixed cutting edge for isolating, respectively separating the foremost chip module from the row arrangement. The method thus makes it possible to utilize a device that can be accommodated in an extremely confined space and that utilizes the cutting movement simultaneously for transfer of the cut-off, respectively separated chip module to the application device.

In order to be able to maintain a defined spatial alignment of the chip modules already during supply of the chip modules in a row arrangement and to be able to largely preclude positional changes of the chip module due to the cutting movement, it is advantageous if the foremost chip module is retained on an abutment surface of the cutting arm while being separated from the row arrangement and while being transferred to the application device. At the same time, it is hence ensured that the separated chip module is placed in a defined position during transfer to the application device.

A particularly efficient configuration requiring reduced mechanical complexity to achieve a retaining function can be realized if the chip module is retained against the abutment surface by means of the application of underpressure.

In order to be able to ensure a defined and reproducible positioning of the chip module also subsequent to the transfer to the application device, it is advantageous if the cutting arm is swiveled with its abutment surface against an abutment surface of the application device for transferring the chip module to the application device in such a manner that the application of underpressure at the cutting arm is maintained until abutment against the abutment surface of the application device is realized and underpressure is subsequently applied to the chip module via the abutment surface of the application device.

An application being performed as directly as possible subsequent to the transfer of the chip module to the application device is enabled if the application device comprising the chip module retained on the abutment surface is moved towards the antenna substrate for performing positioning with subsequent contacting and is exposed to ultrasonic vibrations while abutting against the antenna substrate.

An advantageous adaptation of the method to the respective width of the antenna module web, respectively to the number of the antenna modules arranged along the width of the antenna module web, is rendered possible if for supplying, separating and applying the chip modules, a plurality of antenna modules disposed in a matrix arrangement are assigned a number of row arrangements of the chip modules of the matrix arrangement, said number corresponding to the number of row arrangements of the matrix arrangement which are advanced into the feeding direction, in such a manner that the row arrangements are advanced into the same direction as the assigned rows of the matrix arrangement.

The method can be performed in a particularly simple and space-saving manner in antenna modules disposed in a matrix arrangement if the supplying devices, separating devices and application devices assigned to each row of the matrix arrangement are accommodated in a stationary portal arrangement and if the antenna modules disposed in the matrix arrangement are passed through underneath the portal arrangement in a clocked manner.

To attain this object, the inventive device features a supply device for supplying a plurality of chip modules disposed in a row arrangement on a sheet carrier, a separating device for separating the chip modules from the row arrangement and transferring the separated chip module to an application device, wherein the application device serves for positioning the chip module on an antenna substrate of the antenna module and contacting of the antenna contact surfaces of the chip module with the contact surfaces of the antenna.

According to a preferred embodiment, the device has a separating device that features a supply channel comprising a cutting edge formed at the frontal end in the feeding direction and a cutting arm being swivelable with respect to the supply channel and comprising a second cutting edge which can be moved past the first cutting edge.

It is particularly advantageous if the cutting arm is furnished with an abutment surface for accommodating the chip module and which is equipped with a retainer device for fixing the chip module to the abutment surface.

The retainer device is preferably formed as an underpressure device which is arranged in the abutment surface.

A particularly space-saving and functionally integrated configuration of the device is enabled if the cutting arm, with the abutment surface thereof, is swivelable against an abutment surface of the application device and if the abutment surface of the application device is equipped with an underpressure device for taking over the chip module from the abutment surface of the cutting arm.

For performing the application directly subsequent to taking over the chip module from the separating device, the application device features a feeding device for moving the chip module arranged on the abutment surface against the antenna substrate and an ultrasonic device for exposing the chip module arranged on the abutment surface to ultrasonic vibrations.

A particularly compact configuration of the device is enabled if the supply device, the separating device and the application device form an application module that is arranged on a common carrier frame.

A substantially autarkic operation of the device being essentially independent of the storage devices arranged at the outside of the antenna substrate web can be realized if the application module is equipped with a storage device for arrangement of an endless sheet carrier in the form of a roll.

A particularly simple and fast adaptation of the device to varying web widths of the antenna module web or varying numbers of rows of antenna modules formed in the antenna module web is realizable if the application modules can be combined in any optional number for forming an application unit.

BRIEF DESCRIPTION OF THE DRAWINGS

A preferred variant of the inventive method and a preferred device utilized in the implementation of the variant will be explained in more detail with reference to the drawings specified below.

In the drawings:

FIG. 1 shows a sheet carrier comprising a plurality of row arrangements of chip modules formed thereon;

FIG. 2 shows a single chip module in a plan view;

FIG. 3 shows the chip module in a lateral view;

FIG. 6 shows a chip module contacted on an antenna module in a plan view;

FIG. 7 shows a matrix arrangement of antenna modules in a plan view;

FIG. 8 shows an application device for application of a chip module on an antenna module;

FIG. 9 shows a sealing device for mechanical sealing of the chip module applied onto the antenna module;

DETAILED DESCRIPTION OF THE EXAMPLE EMBODIMENTS

Figure 4:
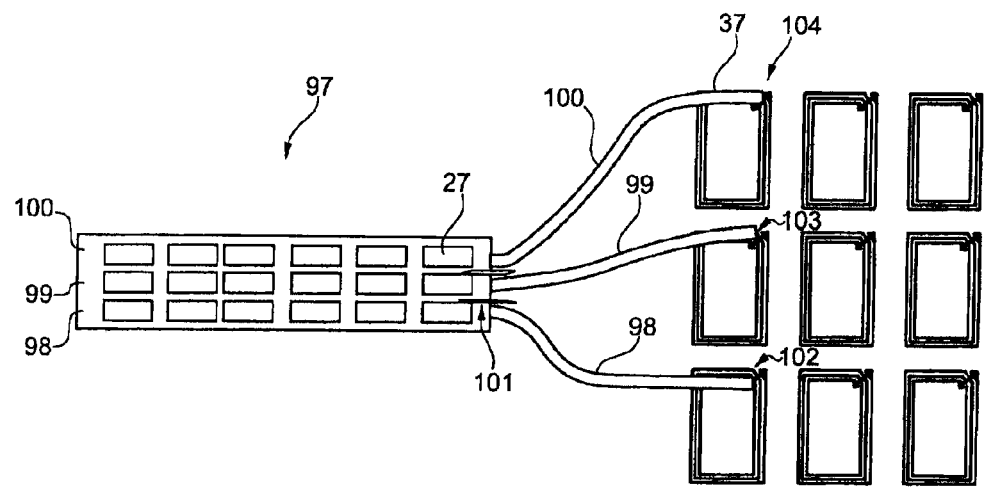
FIG. 4 shows a method variant with row arrangements separated during supply of the sheet carrier.

FIG. 1 shows a sheet carrier 20 that comprises chip modules 27 which are each arranged in a row arrangement 21, 22, 23, 24, 25 and 26 in longitudinal alignment one behind the other. The chip modules 27 are each arranged in the row arrangements 21 to 26 in such a manner that the longitudinal ends 28, 29 of adjacent chip modules 27 directly adjoin one another.

As shown in FIGS. 2 and 3, each individual chip module 27 comprises a carrier substrate 30 which is formed from the material of the sheet carrier 20 and which has two terminal conductors 31, 32 formed thereon, which, in a center region thereof, have a contact surface arrangement 33 for contacting a chip and which, in the region of the longitudinal ends 28, 29 of the chip module 27, each have an antenna contact surface 34 and 35, serving for establishing an electrical contact with an antenna module 37, for instance illustrated in FIG. 4. With the exception of the contact surface arrangement 33 and the antenna contact surfaces 34, 35, in the exemplary embodiment illustrated in FIG. 2, an application surface 36, by means of which the chip module 27 is connected to the antenna module 37 illustrated in FIG. 3, is furnished with a coating layer made of an adhesive material 38.

FIG. 4 schematically illustrates a method variant in which the row arrangements 98, 99, 100 are separated by means of a separating device, here designed in the form of a cutting device 101, from a sheet carrier 97, which comprises a plurality of row arrangements 98 to 100 of chip modules 27 disposed in parallel to one another and extending in the longitudinal direction of the sheet carrier, at a distance from the antenna modules 37 arranged in a matrix arrangement 42 or a matrix assembly. During separation, the row arrangements 98, 99, 100 are further transferred to the respective application locations 102, 103, 104, where the chip modules 27 are contacted with the antenna modules 37. Thus, the separation of the row arrangements 98, 99, 100 and the supply of the row arrangements to the application locations 102, 103, 104 are performed "in line".

Figure 5:
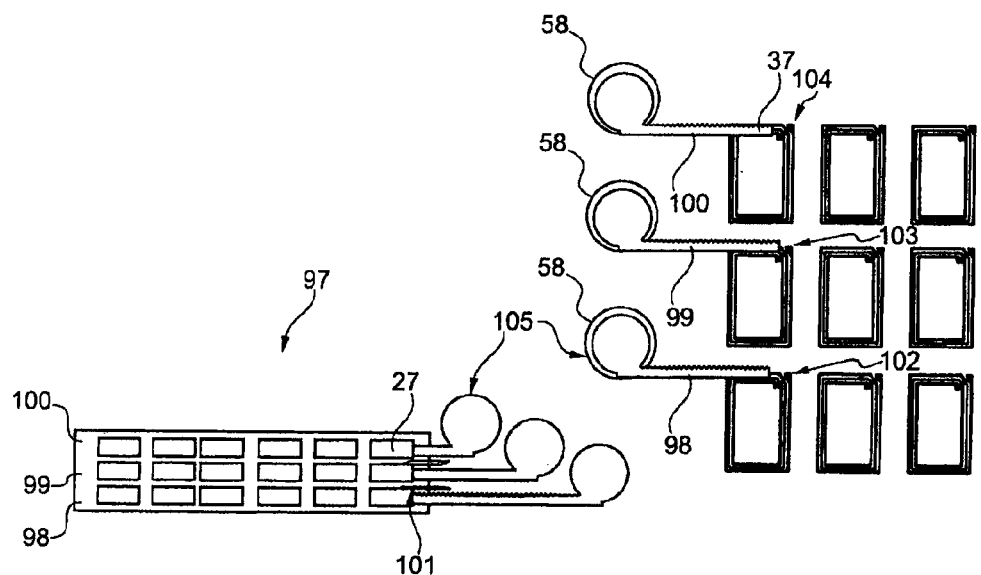
FIG. 5 shows a method variant with row arrangements separated independently of the supply of the sheet carrier.

FIG. 5 schematically illustrates a method variant in which the row arrangements 98 to 100 are separated independently of the supply and of the subsequent contacting of the chip modules firstly by means of the cutting device 101 and are then each rolled up to form a storage roll 105. The storage rolls 105 can then be arranged on storage devices 58 in relative proximity to the application locations 102, 103, 104. Starting from the storage devices 58, the row arrangements 98, 99, 100 are then supplied to the respective application locations 102, 103, 104, where the chip modules 27 are separated from the row arrangements 98, 99, 100 and are contacted with the antenna modules 37.

FIG. 6, as already mentioned above, shows a chip module 27 which is applied to the antenna module 37, i.e. in such a manner that a chip 96 arranged on the carrier substrate 30 or contacted with the contact surface arrangement 33 is contacted in an electrically conductive manner with contact surfaces 40, 41 of an antenna 39 via the antenna contact surfaces 34, 35 illustrated in FIG. 6 using dash-dotted lines, the antenna contact surfaces being formed on an antenna substrate 49 of the antenna module 37.

As is also evident from FIG. 6, for application of the chip module 27 to the antenna module 37, the row arrangements 21 to 26 of the chip module 27 assigned to the chip module 37 are aligned beforehand, as can be seen from the overall view of FIG. 7. Prior to the application of the chip modules 27 which are intended for connection with the individual antenna modules 37, assignment of the row arrangements 21 to 26 is performed, the number of row arrangements corresponding to the rows 43 to 48 of the antenna modules 37 formed in a matrix arrangement 42 of the antenna modules 37. In this process, the row arrangements 21 to 26 of the chip modules 27 are each located in a flush arrangement with the contact surfaces 40, 41 of the antennas 39 formed on the antenna modules 37.

As is apparent from the schematic representation according to FIG. 7, it is basically possible, in case of a separation of the row arrangements 21 to 26 differing from the illustration of FIG. 1, to arrange the individual chip modules 27 of the row arrangements 21 to 26 at a distance from one another, corresponding to the distance between the contact surfaces 40 or 41 of adjacent chip modules, such that the contacting of a plurality of chip modules 27 of a row arrangement 21 to 26 with the antenna modules 37 arranged in a row 43 to 48 could be simultaneously performed.

Figure 14:
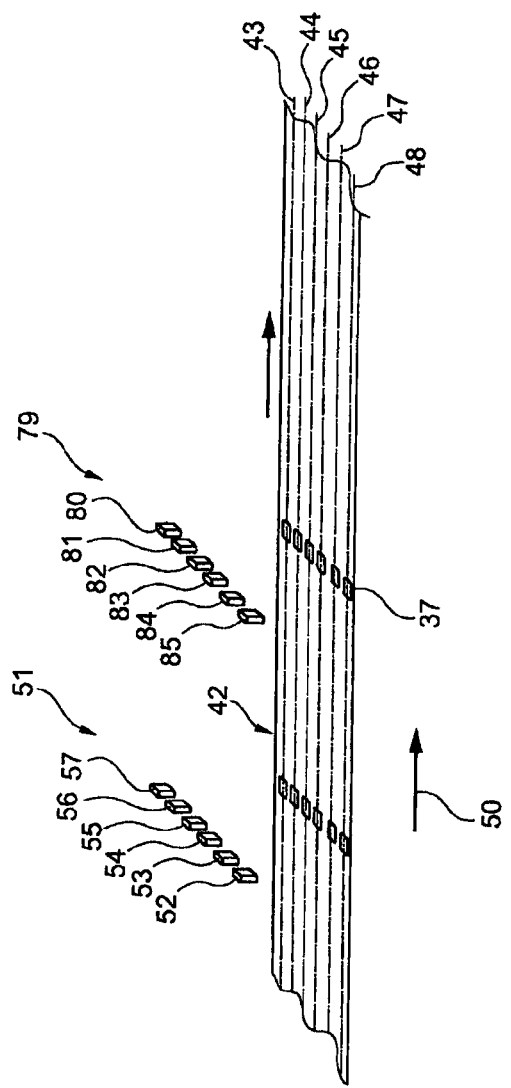
FIG. 14 shows a schematic representation of a system for automated application of chip modules onto antenna modules disposed in a matrix arrangement.

To this end, the matrix arrangement 42 of the antenna modules 37 and the row arrangements 21 to 26 of the chip modules 27 would be synchronously advanced into the production direction 50. Alternatively, however, as illustrated in FIG. 14, it is also possible to make provision for fixed application modules 52 to 57 which are for instance arranged in a common portal arrangement 51 and which are assigned to the individual row arrangements 43 to 48 of the antenna modules 37 arranged in the matrix arrangement 42 on the antenna module carrier 49. In this process, the individual rows 43 to 48 of the antenna modules 37 are passed through underneath the portal arrangement 51 into the production direction.

FIG. 8 shows an application module 52 in an isolated view comprising the functional devices formed thereon, each comprising a storage device 58, a supply device 59, a separating device 60 and an application device 61. The storage device 58 serves for accommodating a row arrangement 21 to 26 of the chip modules 27 in a roll format. By means of the supply device 59, which in the present case is composed of a driving roll unit, the row arrangement is conveyed through a supply channel 62 which is furnished with a cutting edge 65 in the region of the outlet orifice 63 at a channel wall 64 thereof. A cutting arm 66 which is swivelably connected to the supply channel 62 is equally disposed in the region of the outlet orifice 63 and is likewise furnished with a cutting edge 67 which, on a swivel arc 70, is moved past the cutting edge 65 about a swivel axis 68 formed at the supply channel 62 when the cutting arm 66 performs a swiveling motion.

The application device, which features an ultrasonic plunger 72, is located adjacent to the supply channel 62 and with the adjustment axis 69 thereof intersects the swivel arc 70, whereby ultrasonic vibrations are transferred to the ultrasonic plunger 72 via an ultrasonic converter 73.

Figure 10C:
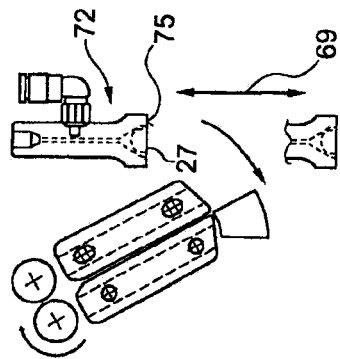
FIG. 10A to FIG. 10C show the operational principle of the application device by illustrating the supply device, the separating device and the application device.

Hereinafter, the function of the application module 52 will be described in more detail with reference to FIGS. 10A to 10C.

Figure 10B:
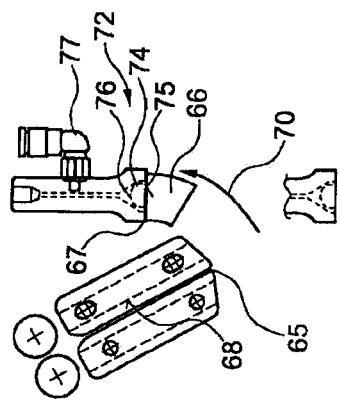
Figure 10A:
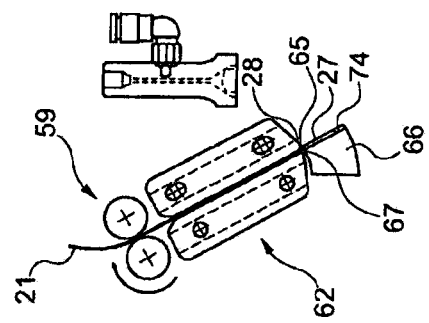

As is apparent from the illustration according to FIG. 10A, the row arrangement 21 is advanced through the supply channel 62 by means of the supply device 59 until the foremost chip module 27 in the row arrangement 21, with the rear longitudinal end 28 thereof, is arranged in the region of the cutting edge 65. In this relative arrangement, the chip module 27 extends over an abutment surface 74 formed on the cutting arm 66. When the chip module 27 has reached the position illustrated in FIG. 10A on the abutment surface 74 of the cutting arm 66, underpressure is applied to the abutment surface 74 by means of an underpressure device (not illustrated here in greater detail), said underpressure fixing the chip module 27 on the abutment surface 74.

Starting from the configuration illustrated in FIG. 10A, according to the representation illustrated in FIG. 10B, swiveling of the cutting arm 66 about the swivel axis 68 is performed in such a manner that the abutment surface 74 comprising the chip module 27 arranged thereon describes the swivel arc 70, wherein the cutting edge 67 formed at the abutment surface 74 is moved past the fixed cutting edge 65 resulting in that the chip module 27, in the region of the rear longitudinal end 28 thereof, is isolated from the row arrangement 21.

Simultaneously with the movement performed on the swivel arc 70 to perform isolation, as can be seen from FIG. 10B, the chip module 27 arranged on the abutment surface 74 is moved against an abutment surface 75 formed at the ultrasonic plunger 72.

As is evident from FIG. 10B, the abutment surface 75, at the rear side thereof, is equipped with an underpressure device 76 that is provided with an underpressure terminal 77 for connection to an underpressure source (not illustrated here in greater detail). For transferring the chip module 27 from the abutment surface 74 of the cutting arm 66 to the abutment surface 75 of the ultrasonic plunger 72, the application of underpressure to the abutment surface 75 is activated and the application of underpressure to the abutment surface 74 is deactivated. After deactivation of the application of underpressure to the abutment surface 74, as illustrated in FIG. 10C, a backward movement of the cutting arm 66 on the swivel arc 70 is performed until the initial position of the cutting arm 66 illustrated in FIG. 10A is reached, in which initial position the subsequent chip module 27 in the row arrangement can be positioned on the abutment surface 74 by means of another feeding movement of the row arrangement 21.

Figure 11:
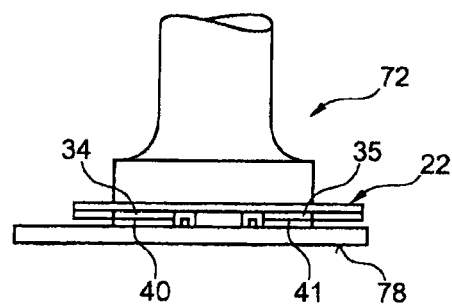
FIG. 11 shows the application device during electrical contacting of the chip module with the antenna module.

Simultaneously with or subsequent to the backward movement of the cutting arm 66 on the swivel arc 70, a vertical feeding movement of the ultrasonic plunger 72 is performed longitudinally along the feed axis 69 in such a manner that the chip module 27 fixed at the abutment surface 75 is moved against the antenna substrate 78 via the application of underpressure 75, as shown in FIG. 11. In this process, the antenna contact surfaces 34, 35 of the chip module 27 are caused to overlap with the contact surfaces 40, 41 of the antenna 39. By means of exposing the ultrasonic plunger to ultrasonic vibrations, an electrically conductive welding contact is finally established between the antenna contact surfaces 34, 35 and the contact surfaces 40, 41 of the antenna 39. The production of the welding connection is particularly efficient with the aid of ultrasound technology if both the antenna contact surfaces 34, 35 and the contact surfaces 40, 41 are composed of aluminum.

As can be seen in particular from FIG. 14, in addition to the portal arrangement 51 comprising the plurality of application modules 52 to 57 formed thereon, provision is made for another portal arrangement 79 that exhibits a plurality of sealing modules 80 to 85. The sealing modules 80 to 85 are correspondingly assigned to the application modules 52 to 57 in terms of their assignment to the individual row arrangements 43 to 48 of the antenna modules 37. In contrast to the application modules 52 to 57, the sealing modules 80 to 85 are placed closer at the front in the production direction 50 and, subsequent to the preceding electrical contacting of the antenna contact surfaces 34, 35 of the chip module 27 with the contact surfaces 40, 41 of the antennas 39 of the antenna modules 37, serve for producing the sealing between the chip module 27, respectively the carrier substrate 30 of the chip module 27, and the antenna substrate 49 of the antenna module 37.

FIG. 9 shows a sealing module 80 comprising an ultrasonic plunger 86 to which ultrasonic vibrations can be applied using an ultrasonic converter 87. Moreover, the ultrasonic plunger 86 is furnished with a feeding device 88 that makes it possible to feed the ultrasonic plunger 86 into the direction of a feed axis 89.

Figure 12:
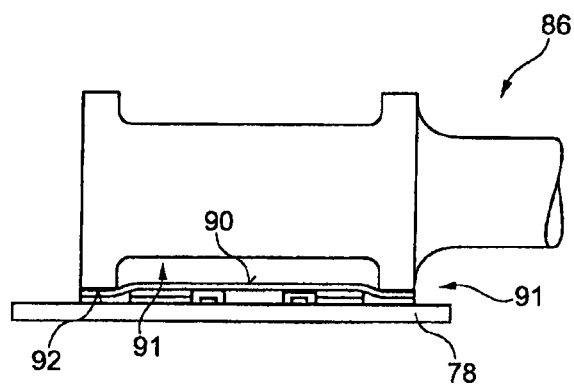
FIG. 12 shows the sealing device during the sealing process of the chip module with the antenna module.
Figure 13:
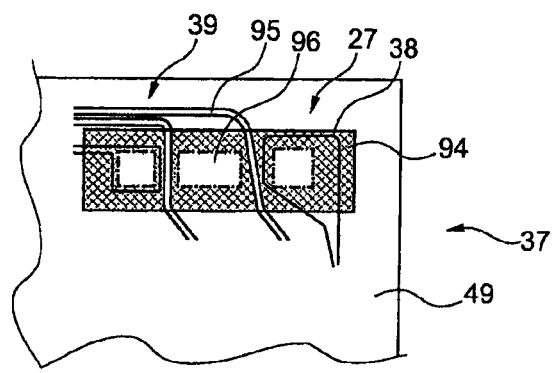
FIG. 13 shows a plan view of the chip module that is electrically contacted with the antenna module and mechanically sealed with the antenna module.

As can be seen from a combined view of FIGS. 9 and 12, the ultrasonic plunger 86 is furnished with an indentation profile 91 that forms a peripheral contact frame 93 in the region of an abutment surface 92 against a back side of the carrier substrate 30, the contact frame having dimensions and a profile width configured such that a contact region 94 with the carrier substrate 30 illustrated in a hatched manner in FIG. 13 is realized. Due to the application of ultrasound to the carrier substrate 30, a solid and mechanically resistant connection is produced in the contact region 94 between the adhesive material 38, which is preferably formed as a contact adhesive and is applied to the application surface 36 of the chip module 27 (FIG. 2 and FIG. 3), and the antenna substrate 49 of the antenna module 37. Due to the insulating effect produced by the adhesive material 38, the adhesively bonded contact producing a hermetic seal and a mechanically resistant connection can be established both between the adhesive material 38 and the substrate material of the antenna substrate 49 as well as between the adhesive material 38 and regions of windings 95 of the antenna 39 that are bridged via the chip module 27.

The invention claimed is:

1. A method for application of a chip module to an antenna module, said method comprising:
    arranging a plurality of chip modules in a row arrangement on a sheet carrier;
    supplying the row arrangement to a separating device arranged at an application location to separate a chip module from the row arrangement;
    separating the chip module from the row arrangement by detachably fixing the chip module forming part of the row arrangement to a swivealable cutting arm of the separating device, and then swiveling the cutting arm along an arc path past a first fixed cutting edge of the separating device cutting the chip module from the row arrangement;
    transferring the chip module from the row arrangement to an application device, said transferring the chip module separated from the row arrangement of chip modules includes detaching the chip module from the cutting arm;
    positioning the chip module separated from the row arrangement on the antenna substrate using the application device; and
    contacting antenna contact surfaces formed on an application side of the chip module with contact surfaces of an antenna disposed on an antenna side of an antenna substrate in an electrically conductive manner.

2. The method according to claim 1, in which the sheet carrier features a plurality of row arrangements which extend in parallel to one another in the longitudinal direction of the sheet carrier and which are separated at a distance from the application location in order to be supplied to the separating device at the application location in the form of individual row arrangements.

3. The method according to claim 2, in which the separation of the row arrangements from the sheet carrier is performed while the row arrangement is supplied to the separating device.

4. The method according to claim 2, in which the separation of the row arrangements from the sheet carrier is performed independently of the supply of the row arrangement to the separating device.

5. The method according to claim 4, in which the row arrangements separated from the sheet carrier are each rolled up and arranged on a storage device in the form of a storage roll and are subsequently supplied to the separating device starting from the storage device.

6. The method according to claim 1, in which subsequent to the positioning and preceding the contacting in a contact region surrounding a chip and the antenna contact surfaces, an adhesively bonded connection is established between the chip module and the antenna substrate.

7. The method according to claim 1, in which subsequent to the contacting in a contact region surrounding a chip and the antenna contact surfaces, an adhesively bonded connection is established between the chip module and the antenna substrate.

8. The method according to claim 7, in which for producing the contact region, the chip module is exposed to ultrasonic vibrations in the contact region when the adhesively bonded connection between the chip module and the antenna substrate is established.

9. The method according to claim 1, in which for performing the separation, the row arrangement of the chip modules is guided out of a supply channel until a rear longitudinal end of a foremost chip module in the supply channel is brought into contact with the first fixed cutting edge of the separating device, which defines an end of the supply channel, and the cutting arm comprising a second cutting edge is subsequently swiveled past the first fixed cutting edge for separating the foremost chip module from the row arrangement and for transfer to the application device.

10. The method according to claim 9, in which the foremost chip module is retained on an abutment surface of the cutting arm while being separated from the row arrangement and while being transferred to the application device.

11. The method according to claim 10, in which the chip module is retained against the abutment surface with the aid of the application of underpressure.

12. The method according to claim 11, in which for transferring the chip module to the application device, the cutting arm is swiveled against an abutment surface of the application device in such a manner that the application of underpressure at the cutting arm is maintained until abutment against the abutment surface of the application device is reached and underpressure is subsequently applied to the chip module via the abutment surface of the application device.

13. The method according to claim 10, in which for positioning with subsequent contacting, the application device comprising the chip module retained on the abutment surface of the application device is moved against the antenna substrate and is exposed to ultrasonic vibrations while abutting against the antenna substrate.

14. The method according to claim 1, in which for supplying, separating and applying the chip modules, a plurality of antenna modules disposed in a matrix arrangement are assigned a number of row arrangements of the chip modules of the matrix arrangement, said number corresponding to the number of rows of the matrix arrangement which are advanced into a feeding direction in such a manner that the row arrangements are advanced into the same direction jointly with the assigned rows.

15. The method according to claim 14, in which supplying devices, separating devices and application devices assigned to each row of the matrix arrangement are accommodated in a stationary portal arrangement and the antenna modules disposed in the matrix arrangement are passed through underneath the portal arrangement in a clocked manner.

* * * * *